United States Patent [19]

Arvanitis

[11] 4,329,666

[45] May 11, 1982

[54] TWO-POLE MONOLITHIC CRYSTAL FILTER

[75] Inventor: Aristotelis S. Arvanitis, Addison, Ill.

[73] Assignee: Motorola, Inc., Schaumburg, Ill.

[21] Appl. No.: 176,630

[22] Filed: Aug. 11, 1980

[51] Int. Cl.³ .......................... H03H 9/56; H03H 9/15
[52] U.S. Cl. .................................... 333/191; 310/320; 310/366; 333/189
[58] Field of Search ............................... 333/186–192; 310/320, 321, 323, 357, 365, 366; 455/285–286; 358/904–905; 331/107 A

[56] References Cited

U.S. PATENT DOCUMENTS

| | | | |
|---|---|---|---|
| 2,323,610 | 7/1943 | Koch | 333/187 X |
| 3,517,350 | 6/1970 | Beaver | 333/191 |
| 3,564,463 | 2/1971 | Beaver et al. | 333/191 |
| 3,573,672 | 4/1971 | Fair et al. | 333/191 |
| 3,576,506 | 4/1971 | Reynolds et al. | 310/320 X |
| 3,599,124 | 8/1971 | Smith et al. | 333/191 X |
| 3,609,601 | 9/1971 | Phillips et al. | 333/192 |
| 3,727,154 | 4/1973 | Dailing et al. | 333/191 |
| 3,898,489 | 8/1975 | Grady et al. | 333/187 |
| 4,013,982 | 3/1977 | Wood et al. | 333/192 |
| 4,156,214 | 5/1979 | Arvanitis et al. | 333/191 |
| 4,163,959 | 8/1979 | Dailing | 333/191 |

OTHER PUBLICATIONS

Beaver-"Theory and Design Principles of the Monolithic Crystal Filter", Ph. D. Dissertation, Lehigh University, 1967; pp. i, iv-xx and 1-50.

Primary Examiner—Marvin L. Nussbaum
Attorney, Agent, or Firm—Rolland R. Hackbart; James W. Gillman

[57] ABSTRACT

A two-pole monolithic crystal filter is described that includes grounded strip electrodes between input and output electrodes. The grounded strip electrodes have a higher resonating frequency than the input and output electrodes and also provide increased acoustical coupling and lower inter-electrode capacitance between the input and output electrodes, while having little or no effect on the midband electrical characteristics of the filter. Because of the increased coupling, the input and output electrodes can be spaced further apart than heretofore possible in prior monolithic crystal filters. Moreover, further increases in the acoustical coupling can be achieved by arranging a plurality of strip electrodes between the input and output electrodes. The inventive monolithic crystal filter can be advantageously utilized for filtering the IF signal developed in the IF portion of an FM radio receiver.

26 Claims, 8 Drawing Figures

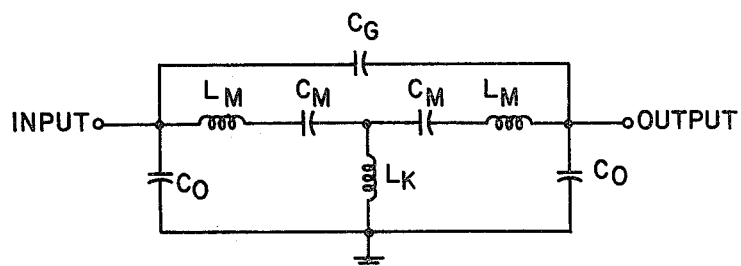
FIG. 6
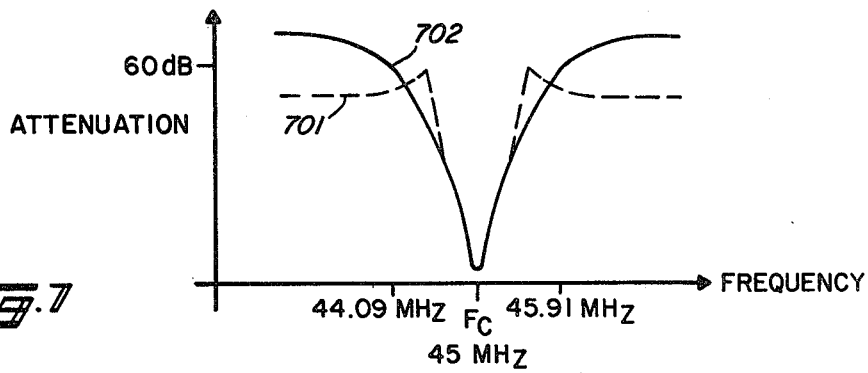
FIG. 7
FIG. 8
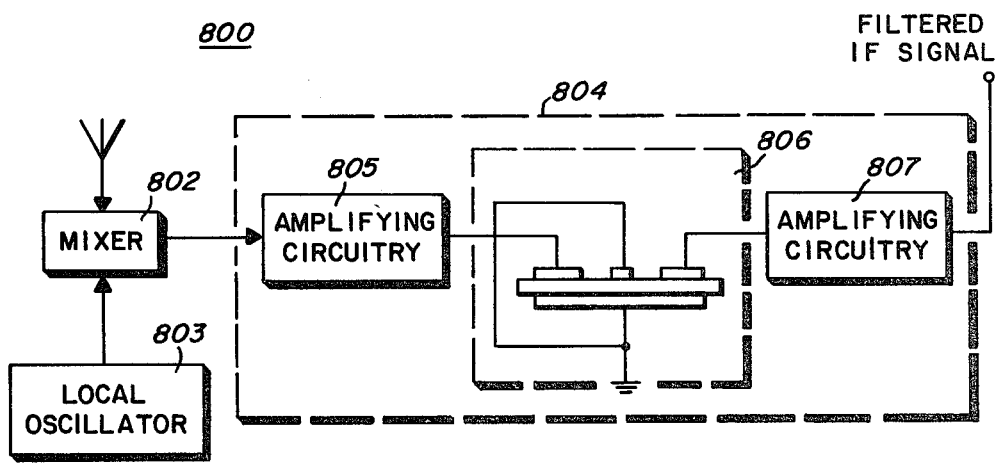

TWO-POLE MONOLITHIC CRYSTAL FILTER

BACKGROUND OF INVENTION

The present invention relates generally to filters, and more particularly to two-pole monolithic crystal filters having improved coupling and attenuation characteristics.

Prior art monolithic crystal filters, as illustrated in FIGS. 1 and 2, typically include pairs of opposingly disposed electrodes plated on opposite surfaces of a quartz crystal wafer 100. The monolithic crystal filter may include pairs of electrodes 101, 103, and 102, 104 as in FIG. 1, or may include separate input and output electrodes 105 and 106 and a common electrode 107 as in FIG. 2. The basic electrical characteristics of such monolithic crystal filters are generally described in William D. Beaver's PhD Dissertation entitled, "Theory and Design Principles of the Monolithic Crystal Filter", Lehigh University, 1967.

The acoustical coupling between the input and output electrodes of a monolithic crystal filter is dependent upon, among other things, the distance between the electrodes along the axis of coupling, the length of the sides of the electrodes parallel to the axis of coupling and the difference in the resonating frequency between the plated and the unplated surfaces of the crystal wafer, which is typically referred to as the plateback. In order to resonate at higher frequencies, the electrodes of the monolithic crystal filter may be designed to operate in an overtone mode of oscillation. However, in order to provide adequate coupling in an overtone mode filter, the input and output electrodes must be arranged extremely close together. But, as the input and output electrodes are moved closer together, problems are encountered both in manufacturing such overtone mode filters due to tolerance variations and in degradation of the attenuation characteristics of such overtone mode filters due to the capacitance between the input and output electrodes.

The degradation in the attenuation characteristics of overtone mode filters may be lessened somewhat by overlapping the electrodes as described in U.S. Pat. No. 4,163,959. According to another prior monolithic crystal filter arrangement, the capacitance between the input and output electrode may be reduced by placing additional grounded electrodes between the input and output electrodes. But, such additional electrodes must have the same resonating frequency as the input and output electrodes. It has also been demonstrated for another prior monolithic crystal filter arrangement that the acoustical coupling between the input and output electrodes can be vernier adjusted by plating the interelectrode region. However, none of the foregoing monolithic crystal filter arrangements provide viable solutions for the problems created due to the extremely close spacing required between the input and the output electrodes for overtone mode operation.

SUMMARY OF THE INVENTION

Accordingly, it is an object of the present invention to provide an improved monolithic crystal filter that has improved coupling and attenuation characteristics.

It is another object of the present invention to provide an improved monolithic crystal filter that is readily adaptable to resonate in overtone modes.

It is yet another object of the present invention to provide an improved monolithic crystal filter that is easily and inexpensively manufactured by means of mass production techniques.

In practicing the present invention, an improved monolithic crystal filter having a predetermined passband and passband center frequency, $F_c$, includes a piezoelectric substrate, a first pair of electrodes opposingly disposed on the surfaces of the substrate, a second pair of electrodes opposingly disposed on the surfaces of the substrate at a predetermined distance from the first pair of electrodes and a pair of strip electrodes opposingly disposed on the surface of the substrate between the first and second pair of electrodes. Both the first and second pair of electrodes are adapted to resonate at the passband center frequency, $F_c$, whereas the pair of strip electrodes have a predetermined resonating frequency greater than the passband center frequency, $F_c$. Because their physical dimensions are smaller than those of the first and second pairs of electrodes, the strip electrodes will have both a higher resonating frequency and a higher impedance than the first and second pairs of electrodes. Thus, the strip electrodes have little or no effect on the midband electrical characteristics of the monolithic crystal filter, while improving the acoustical coupling and reducing the interelectrode capacitance between the first and second pairs of electrodes. Furthermore, by providing additional pairs of strip electrodes, the acoustical coupling between the first and second pairs of electrodes may be further increased. When operated in a third overtone mode, a monolithic crystal filter embodying the present invention exhibits a wide passband while highly attenuating signals outside of the passband.

BRIEF DESCRIPTION OF THE DRAWINGS

FIG. 6 is an equivalent electrical circuit diagram for a monolithic crystal filter.

FIG. 7 is a graph illustrating representative attenuation waveforms 701 and 702 for the monolithic crystal filters in FIGS. 1 and 3, respectively.

FIG. 8 is a block diagram of a portion of a radio receiver that may advantageously utilize a monolithic crystal filter embodying the present invention.

DETAILED DESCRIPTION OF THE PREFERRED EMBODIMENT

Figure 3:
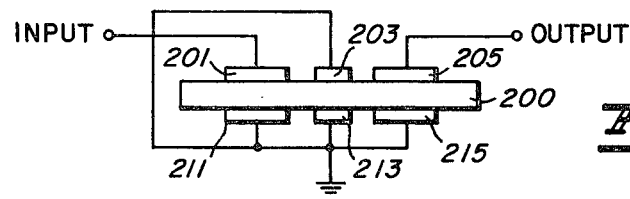
FIG. 3 is an edge view of a monolithic crystal filter embodying the present invention.

In FIG. 3, there is illustrated a two-pole monolithic crystal filter embodying the present invention. The filter includes a substrate 200 which is comprised of a piezoelectric material, such as quartz. The thickness of the quartz substrate 200 primarily determines its fundamental resonating frequency. Disposed on the surfaces of the quartz substrate 200 are first and second pairs of electrodes 201, 211, and 205, 215, having input and output terminals which may be coupled to receive and provide input and output signals, respectively. Each electrode is preferably formed of an electrically conductive material, typically gold, which is plated on the surface of the substrate 200 to a predetermined thickness. In the preferred embodiment, the substrate 200 is an AT cut quartz crystal on which the pairs of electrodes may be aligned either along the "X" or "Z" crystallographic axis of the quartz.

The two-pole monolithic crystal filter of FIG. 3 further includes a pair of strip electrodes 203, 213. The strip electrodes 203, 213 and the input and output electrodes 201, 211 and 205, 215, viewed from above, have a rectangular shape, although they may take the shape of any parallelogram where the opposing sides of each electrode are the same length. The strip electrodes 203, 213, preferably have the same thickness and length as the input and output electrodes 201, 211 and 205, 215, but have a smaller width. Due to the fact that their width is smaller, the strip electrodes 203, 213, have a higher resonating frequency than the input and output electrodes 201, 211 and 205, 215. In addition to their frequency being higher, the strip electrodes 203, 213 also have a higher impedance than the input and output electrodes 201, 211 and 205, 215, and thus have little overall effect on the midband electrical characteristics of the input and output electrodes 201, 211 and 205, 215.

Figure 4:
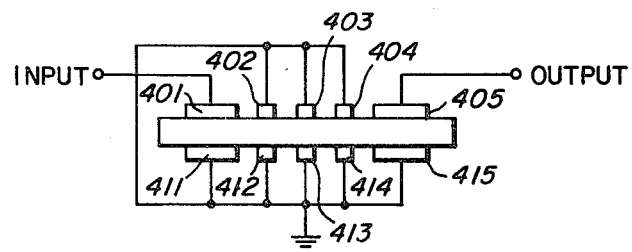
FIG. 4 is an edge view of a different monolithic crystal filter embodying the present invention.

Referring to FIG. 4, a two-pole monolithic crystal filter is shown that has input and output electrodes 401, 411 and 405, 415 and three pairs of strip electrodes 402, 412, 403, 413 and 404, 414, which all have the same resonating frequency. The strip electrodes 402, 412, 403, 413, and 404, 414 have the same thickness and length as the input and output electrodes 401, 411 and 405, 415, but have a smaller width causing them to have a higher frequency than the input and output electrodes 401, 411 and 405, 415. Any number of pairs of strip electrodes having the same resonating frequency can be disposed between the input and output electrodes of a two-pole monolithic crystal filter in practicing the present invention.

Figure 5:
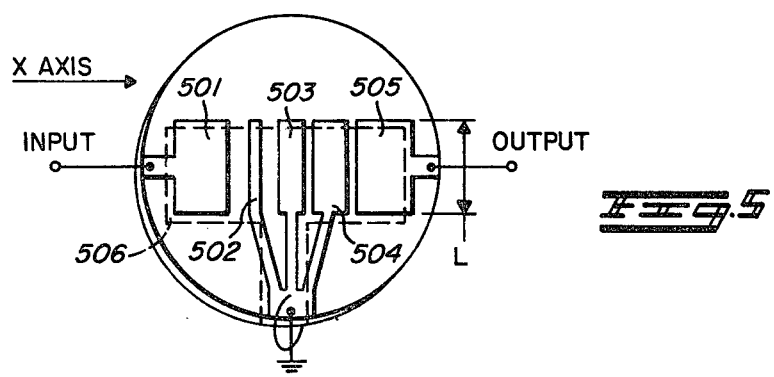
FIG. 5 is a top view of yet a different monolithic crystal filter embodying the present invention.

Furthermore, as illustrated in FIG. 5, the width of the strip electrodes may vary. Strip electrode 504 has a greater width than strip electrode 503, which has a greater width than strip electrode 502. But, all strip electrodes 502, 503, and 504 have a width less than the width of the input and output electrodes 501 and 505. The electrodes in FIG. 5 are shown as being aligned along the "X" crystallographic axis and are all opposed by a single common electrode 506.

Figure 1:
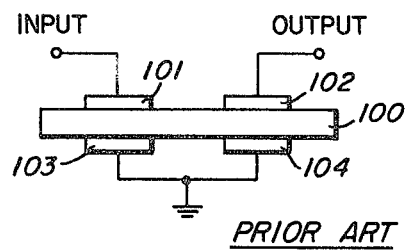
FIG. 1 is an edge view of a prior art monolithic crystal filter.
Figure 2:
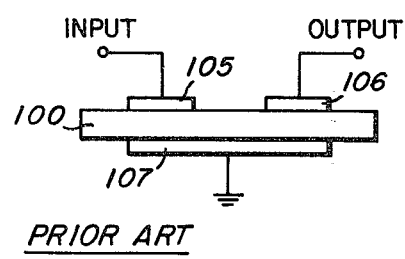
FIG. 2 is an edge view of a different prior art monolithic crystal filter.

According to the present invention, the strip electrodes 203 and 213 in FIG. 3 not only significantly improve the acoustical coupling between the input and output electrodes 201, 211 and 205, 215, but also improve the attenuation of signals outside the filter passband, commonly termed the ultimate attenuation. In prior art monolithic crystal filters, there is what is commonly referred to as a "gimmic" capacitance, $C_g$ (see FIG. 6), between input and output electrodes, such as electrodes 101 and 102 in FIG. 1. The presence of the gimmic capacitance, $C_g$, causes the attenuation waveform of a monolithic crystal filter to peak at the edges of the filter passband and thereafter decrease somewhat for frequencies beyond the filter passband, as illustrated by the dotted line waveform 701 in FIG. 7. Thus, in order to improve the ultimate attenuation as in waveform 702 in FIG. 7, it is necessary to reduce or eliminate the gimmic capacitance between the input and output electrodes of a monolithic crystal filter.

In accordance with the present invention, the gimmic capacitance, $C_g$, between the input and output electrodes 201 and 205 in FIG. 3 can be substantially reduced by grounding the strip electrodes 203 and 213. But, grounding the strip electrodes 203 and 213 may also increase somewhat the capacitance, $C_O$ (see FIG. 6), between the input and output electrodes 201 and 205 and signal ground, slightly affecting the filter center frequency, $F_c$. However, any slight changes in the capacitance, $C_O$, can be readily accommodated during the design of a monolithic crystal filter.

Not only does the monolithic crystal filter of the present invention minimize the gimmic capacitance, $C_g$, but also increases the acoustical coupling, $L_k$ (see FIG. 6) between the input and output electrodes 201, 211 and 205, 215 in FIG. 3. The acoustical coupling, $L_k$, is dependent upon, among other things, the thickness of the electrodes, the distance between the input and output electrodes along the axis of coupling, the length of the sides of the electrodes parallel to the axis of coupling and the difference in resonating frequency between the plated and unplated areas of the substrate 200, which is commonly referred to as the plateback. The acoustical coupling could be increased in prior art monolithic crystal filters by placing the input and output electrodes closer together. For example, in overtone mode filters, the input and output electrodes must be extremely close together to attain sufficient coupling to make them perform as designed. Due to tight tolerance restrictions, the placement of the input and output electrodes must be accurately controlled when fabricating such overtone mode filters to insure adequate yield. However, by utilizing the monolithic crystal filter of the present invention, the foregoing problems have been substantially eliminated since an increase in coupling can be achieved without the tight tolerance restrictions encountered when placing the input and output electrodes close together. By utilizing the strip electrodes 203, 213 in accordance with the present invention, the effective plateback may be reduced to provide a corresponding increase in the acoustical coupling. The effective plateback is reduced because the addition of the strip electrodes reduces the effective difference in resonating frequency between the plated and unplated areas of the substrate 200 between the input and output electrodes 201, 211 and 205, 215. Moreover, a further reduction in the effective plateback can be achieved by adding additional pairs of strip electrodes between the input and output electrodes, as illustrated by the monolithic crystal filter embodiment in FIG. 4. Even further improvement results when a single common electrode is utilized on the surface opposite to the input, output and strip electrodes, as illustrated by the monolithic crystal filter embodiments in FIGS. 5 and 8. Moreover, yet another benefit resulting from a plurality of strip electrodes, as illustrated by the monolithic crystal filters in FIGS. 4 and 5, is that the filter passband is widened without resorting to a multi-pole crystal filter arrangement.

A monolithic crystal filter embodying the present invention may be advantageously utilized in any application requiring a wide passband and a high degree of attenuation of signals outside the filter passband. For example, the monolithic crystal filter of the present invention may be utilized in the IF portion of a radio receiver, such as that illustrated in FIG. 8. Such radio receivers have an intermediate frequency (IF) portion that typically operates at frequencies between 10-45 MHz. In the FM receiver 800 in FIG. 8, mixer 802 combines the received signal from an antenna with a signal from local oscillator 803 to provide an IF signal. However, the IF signal from mixer 802 must next be filtered by IF filter 804 to remove unwanted harmonic signals produced by the signal multiplication in mixer 802. If filter 804 may typically include amplifying and impedance matching circuitry 805 which receives and amplifies the signal from mixer 802. The signal from amplifying circuitry 805 may then be applied to a monolithic crystal filter 806 embodying the present invention. The filtered IF signal from monolithic crystal filter 806 may then be coupled to impedance matching and amplifying circuitry 807 for further amplification and impedance matching, if necessary, prior to application to succeeding receiver stages. For such FM radio receiver applications, a monolithic crystal filter embodying the present invention may be arranged to provide third overtone operation, for example, at an IF frequency of 45 MHz, while having a passband as great as 32 KHz and maintaining a minimum of 60 dB of attenuation of signals at least 910 KHz away from the passband center frequency, $F_c$ (see waveform 702 in FIG. 7). It should be understood that the monolithic crystal filter of the present invention may be advantageously utilized in any FM radio, such as those described in Motorola Instruction Manuals, 68P81020E10 and 68P81029E65, published by Motorola Service Publications, Schaumburg, Ill., 1975 and 1977, respectively.

In summary, an improved two-pole monolithic crystal filter has been described that provides increased coupling and ultimate attenuation through the use of strip electrodes interposed between the input and output electrodes. By using such strip electrodes, a high degree of coupling can be maintained while at the same time increasing the separation distance between the input and output electrodes. As a result, overtone mode monolithic crystal filters may be more easily and economically manufactured.

I claim:

1. An improved monolithic crystal filter having a predetermined passband and passband center frequency, comprising:
    a piezoelectric substrate having first and second flat, parallel surfaces, the substrate having a predetermined fundamental frequency that is greater than the passband center frequency;
    first electrode means including a pair of electrodes opposingly disposed on the surfaces of the substrate, the first electrode means being adapted to resonate substantially at the passband center frequency;
    second electrode means including a pair of electrodes opposingly disposed on the surfaces of the substrate at a predetermined distance from the first electrode means, the second electrode means being adapted to resonate substantially at the passband center frequency;
    strip electrode means including a pair of electrodes opposingly disposed on the surfaces of the substrate between the first electrode means and the second electrode means, the strip electrode means having a resonating frequency greater than the passband center frequency and further being electrically grounded.

2. The monolithic crystal filter according to claim 1, wherein the piezoelectric crystal substrate is quartz, and the first electrode means, second electrode means and the strip electrode means are substantially aligned with respect to a predetermined crystallographic axis of the quartz substrate.

3. The monolithic crystal filter according to claim 2, wherein the first electrode means, second electrode means and the strip electrode means are substantially aligned with respect to the "Z" crystallographic axis of the quartz substrate.

4. The monolithic crystal filter according to claim 2, wherein the first electrode means, second electrode means and the strip electrode means are substantially aligned with respect to the "X" crystallographic axis of the quartz substrate.

5. The monolithic crystal filter according to claim 1 2, 3 or 4 wherein each electrode of the first electrode means, second electrode means and strip electrode means is formed in the shape of a parallelogram, and the electrodes of the first electrode means, second electrode means and strip electrode means are further arranged so that all sides are parallel with one another and opposing sides have the same predetermined length.

6. The monolithic crystal filter according to claim 5 wherein each electrode of the first electrode means, second electrode means and strip electrode means have a rectangular shape.

7. The monolithic crystal filter according to claim 1 or 2, wherein the strip electrode means includes a plurality of strip electrode pairs, each strip electrode pair having a resonating frequency that is greater than the passband center frequency.

8. The monolithic crystal filter according to claim 1 or 2, wherein the strip electrode means includes a plurality of strip electrode pairs, each strip electrode pair having substantially the same resonating frequency that is greater than the passband center frequency.

9. The monolithic crystal filter according to claim 1 or 2 adapted for use in a frequency-modulated (FM) signal receiver having an intermediate-frequency (IF) portion for developing an intermediate frequency signal from a received FM signal, said monolithic crystal filter disposed in the IF portion of the FM signal receiver for filtering the IF signal.

10. The monolithic crystal filter according to claim 8, wherein said first electrode means and second electrode means are further adapted to resonate in a predetermined overtone mode.

11. The monolithic crystal filter according to claim 5, wherein each electrode of the first electrode means, second electrode means and strip electrode means is comprised of an electrically conductive material deposited on the surfaces of the substrate at a predetermined thickness.

12. An improved monolithic crystal filter having a predetermined passband and passband center frequency, comprising:
    a piezoelectric substrate having first and second flat parallel surfaces, the substrate having a predetermined fundamental frequency that is greater than the passband center frequency;
    first electrode means predeterminedly disposed on the first surface of the substrate, the first electrode means being adapted to resonate substantially at the passband center frequency;
    second electrode means predeterminedly disposed on the first surface of the substrate at a predetermined distance from the first electrode means, the second electrode means being adapted to resonate substantially at the passband center frequency;
    strip electrode means predeterminedly disposed on the first surface of the substrate between the first electrode means and the second electrode means, the strip electrode means having a resonating frequency that is greater than the passband center frequency; and common electrode means disposed on the second surface of the substrate in opposing relationship to the first electrode means, second electrode means and strip electrode means, the common electrode means further being coupled to the strip electrode means and electrically grounded.

13. The monolithic crystal filter according to claim 12, wherein the piezoelectric crystal substrate is quartz, and the first electrode means, second electrode means and the strip electrode means are substantially aligned with respect to a predetermined crystallographic axis of the quartz substrate.

14. The monolithic crystal filter according to claim 13, wherein the first electrode means, second electrode means and the strip electrode means are substantially aligned with respect to the "Z" crystallographic axis of the quartz substrate.

15. The monolithic crystal filter according to claim 13, wherein the first electrode means, second electrode means and the strip electrode means are substantially aligned with respect to the "X" crystallographic axis of the quartz substrate.

16. The monolithic crystal filter according to claim 12, 13, 14 or 15 wherein the first electrode means, second electrode means and strip electrode means are each paired with separate common electrode means, the first electrode means, second electrode means, strip electrode means and common electrode means being formed in the shape of a parallelogram, and the electrodes of the first electrode means, second electrode means and strip electrode means further being arranged so that all sides are parallel with one another and opposing sides have the same predetermined length.

17. The monolithic crystal filter according to claim 16 wherein each electrode of the first electrode means, second electrode means and strip electrode means have a rectangular shape.

18. The monolithic crystal filter according to claim 12 or 13, wherein the strip electrode means includes a plurality of strip electrodes, each strip electrode having a resonating frequency that is greater than the passband center frequency.

19. The monolithic crystal filter according to claim 12 or 13, wherein the strip electrode means includes a plurality of strip electrodes, each strip electrode having substantially the same resonating frequency that is greater than the passband center frequency.

20. The monolithic crystal filter according to claim 12 or 13 adapted for use in a frequency-modulated (FM) signal receiver having an intermediate-frequency (IF) portion for developing an IF signal from a received FM signal, said monolithic crystal filter disposed in the IF portion of the FM signal receiver for filtering the IF signal.

21. The monolithic crystal filter according to claim 20, wherein said first electrode means and second electrode means are further adapted to resonate in a predetermined overtone mode.

22. The monolithic crystal filter according to claim 16, wherein each electrode of the first electrode means, second electrode means and strip electrode means is comprised of an electrically conductive material deposited on the surfaces of the substrate at a predetermined thickness.

23. An improved monolithic crystal filter having a predetermined passband and passband center frequency, comprising:

a piezoelectric substrate having first and second flat, parallel surfaces, the substrate having a predetermined fundamental frequency that is greater than the filter center frequency;

first electrode means including a pair of rectangular electrodes opposingly disposed on the surfaces of the substrate and each having two opposite sides of a predetermined length, the first electrode means being adapted to resonate substantially at the passband center frequency;

second electrode means including a pair of rectangular electrodes opposingly disposed on the surfaces of the substrate at a predetermined distance from the first electrode means and each having two opposite sides of a predetermined length, the second electrode means being adapted to resonate substantially at the passband center frequency;

strip electrode means including a pair of rectangular electrodes opposingly disposed on the surfaces of the substrate between the first electrode means and the second electrode means and each having two opposite sides of a predetermined length, the strip electrode means having a resonating frequency greater than the passband center frequency and further being electrically grounded, and the electrodes of the first electrode means, second electrode means and strip electrode means further being arranged so that all sides having the predetermined length are parallel with one another.

24. An improved monolithic crystal filter having a predetermined passband and passband center frequency, comprising:

a piezoelectric substrate having first and second flat, parallel surfaces, the substrate having a predetermined fundamental frequency that is greater than the filter center frequency;

first electrode means including a pair of rectangular electrodes opposingly disposed on the surfaces of the substrate and each having two opposite sides of a predetermined length, the first electrode means being adapted to resonate substantially at the passband center frequency;

second electrode means including a pair of rectangular electrodes opposingly disposed on the surfaces of the substrate at a predetermined distance from the first electrode means and each having two opposite sides of a predetermined length, the second electrode means being adapted to resonate substantially at the passband center frequency;

strip electrode means including a plurality of pairs of rectangular electrodes opposingly disposed on the surfaces of the substrate between the first electrode means and the second electrode means and each having two opposite sides of a predetermined length, the strip electrode having a resonating frequency greater than the passband center frequency and further being electrically grounded, and the electrodes of the first electrode means, second electrode means and strip electrode means further being arranged so that all sides having the predetermined length are parallel with one another.

25. An improved monolithic crystal filter having a predetermined passband and passband center frequency, comprising:

a piezoelectric substrate having first and second flat, parallel surfaces, the substrate having a predetermined fundamental frequency that is greater than the passband center frequency;

first electrode means including a pair of electrodes opposingly disposed on the surfaces of the substrate, the first electrode means being adapted to resonate substantially at the passband center frequency;

second electrode means including a pair of electrodes opposingly disposed on the surfaces of the substrate at a predetermined distance from the first electrode means, the second electrode means being adapted to resonate substantially at the passband center frequency;

strip electrode means including a pair of electrodes opposingly disposed on the surfaces of the substrate between the first electrode means and the second electrode means, the electrodes of the strip electrode means having portions extending outwardly toward the periphery of the substrate, and the strip electrode means further having a resonating frequency greater than the passband center frequency and further being electrically grounded.

26. An improved monolithic crystal filter having a predetermined passband and passband center frequency, comprising:

a piezoelectric substrate having first and second flat parallel surfaces, the substrate having a predetermined fundamental frequency that is greater than the passband center frequency;

first electrode means predeterminedly disposed on the first surface of the substrate, the first electrode means being adapted to resonate substantially at the passband center frequency;

second electrode means predeterminedly disposed on the first surface of the substrate at a predetermined distance from the first electrode means, the second electrode means being adapted to resonate substantially at the passband center frequency;

strip electrode means predeterminedly disposed on the first surface of the substrate between the first electrode means and the second electrode means, the strip electrode means having at least one portion extending outwardly toward the periphery of the substrate and further having a resonating frequency that is greater than the passband center frequency; and common electrode means disposed on the second surface of the substrate in opposing relationship to the first electrode means, second electrode means and strip electrode means, the common electrode means further being coupled to the strip electrode means and electrically grounded.

* * * * *